US009778298B2

(12) United States Patent
Noga et al.

(10) Patent No.: US 9,778,298 B2
(45) Date of Patent: *Oct. 3, 2017

(54) APPARATUS FOR FREQUENCY MEASUREMENT

(71) Applicant: THE UNITED STATES OF AMERICA AS REPRESETNED BY THE SECRETARY OF THE AIR FORCE, Washington, DC (US)

(72) Inventors: Andrew J. Noga, Rome, NY (US); Daniel L. Stevens, Marcy, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 288 days.

This patent is subject to a terminal disclaimer.

(21) Appl. No.: 14/735,228

(22) Filed: Jun. 10, 2015

(65) Prior Publication Data
US 2016/0364205 A1  Dec. 15, 2016

(51) Int. Cl.
G06F 3/16 (2006.01)
G01R 23/16 (2006.01)

(52) U.S. Cl.
CPC .................. G01R 23/16 (2013.01)

(58) Field of Classification Search
CPC ....... G06F 17/14–17/142; G01R 23/16; G01R 23/163; G01R 23/165; G01R 23/167; G01R 23/17; G01R 23/173; G01R 23/175; G01R 23/177; G01R 23/18; G01R 23/20

USPC .......... 708/309–312, 403–405; 702/106, 190
See application file for complete search history.

(56) References Cited

U.S. PATENT DOCUMENTS

| 6,078,281 A * | 6/2000 | Milkovich | G06F 17/14 342/162 |
|---|---|---|---|
| 2005/0169165 A1* | 8/2005 | Cimini | H04L 27/2655 370/206 |
| 2009/0062945 A1* | 3/2009 | Trautmann | G10L 19/093 700/94 |
| 2009/0135928 A1* | 5/2009 | Jang | G06F 17/142 375/260 |
| 2009/0323865 A1* | 12/2009 | Bradley | H03G 3/3052 375/330 |

OTHER PUBLICATIONS

Santamaria et al. ("A Comparative Study of High-Accuracy Frequency Estimation Methods" published on Mechanical Systems and Signal Processing, vol. 14, Issue 5, p. 819-834, in Sep. 2000).*
Liu et al. ("An Iterative Frequency Estimation Algorithm Using Generalized Fourier Interpolation" published on Chinese Journal of Electronics, 2009, 18(CJE-3.*

* cited by examiner

*Primary Examiner* — Andrew Caldwell
*Assistant Examiner* — Huiquan Huang
(74) *Attorney, Agent, or Firm* — Joseph A. Mancini

(57) ABSTRACT

An apparatus for frequency measurement (1ODMTM) which provides precise and accurate measurement of a single input tone frequency and/or multiple separable input tone frequencies. Tone separability can be achieved by proper selection of the parameter N, the sample length of the DFT/FFT.

5 Claims, 9 Drawing Sheets

APPARATUS FOR FREQUENCY MEASUREMENT

STATEMENT OF GOVERNMENT INTEREST

The invention described herein may be manufactured and used by or for the Government for governmental purposes without the payment of any royalty thereon.

BACKGROUND OF THE INVENTION

Prior art is represented by the well-known discrete Fourier transform (DFT) or its case-specific efficient implementation, the fast Fourier transform (FFT). Efficient single and multi-tone frequency measurement can be achieved using the prior art. However, even though such prior art is efficient and has desirable noise-reduction properties, direct frequency measurement accuracy is limited to $2\pi/N$ radians.

OBJECTS AND SUMMARY OF THE INVENTION

It is therefore an object of the present invention to provide an apparatus that improves the accuracy of frequency measurements.

It is a further object of the present invention to provide an apparatus that performs accurate frequency measurements without the introduction of bias and discretization.

It is still a further object of the present invention to provide an apparatus that achieves frequency measurement with greater than $2\pi/N$ radians accuracy.

Briefly stated, the present invention achieves these and other objects through an apparatus for frequency measurement (1ODMTM) which provides precise and accurate measurement of a single input tone frequency and/or multiple separable input tone frequencies. Tone separability can be achieved by proper selection of the parameter N, the sample length of the DFT/FFT.

According to an embodiment of the invention, an apparatus for frequency measurement, comprises a signal conditioner having an input and an output; an analog-to-digital converter having an input and an output; a parser having an input and an output; a Fourier Transformer having an input and an output; a selector having an input and an output; and a processor having a signal input, an output, and a coefficient input, where an external analog signal to be measured is input into the input of the signal conditioner; the output of said signal conditioner is connected to the input of the analog-to-digital converter; the output of said analog-to-digital converter is connected to the input of parser; the output of the parser is connected to the input of the Fourier Transformer; the output of the Fourier Transformer is connected to the input of the processor and to the input of the selector; and where the output of the selector is connected to the coefficient input of the processor.

The above and other objects, features and advantages of the present invention will become apparent from the following description read in conjunction with the accompanying drawings, in which like reference numerals designate the same elements.

DETAILED DESCRIPTION OF THE PREFERRED EMBODIMENT

The present invention is the DFT/FFT-based 1st-order difference multi-tone frequency measurement (1ODMTM) apparatus which provides precise and accurate measurement of, a single input tone frequency and/or, multiple separable input tone frequencies. Here, tone separability can be achieved by proper selection of the parameter N, the sample length of the DFT/FFT. Practical application of the 1ODMTM of the present invention includes but is not limited to test and measurement, where precise and accurate measurement of tonal frequencies is needed.

Figure 1:
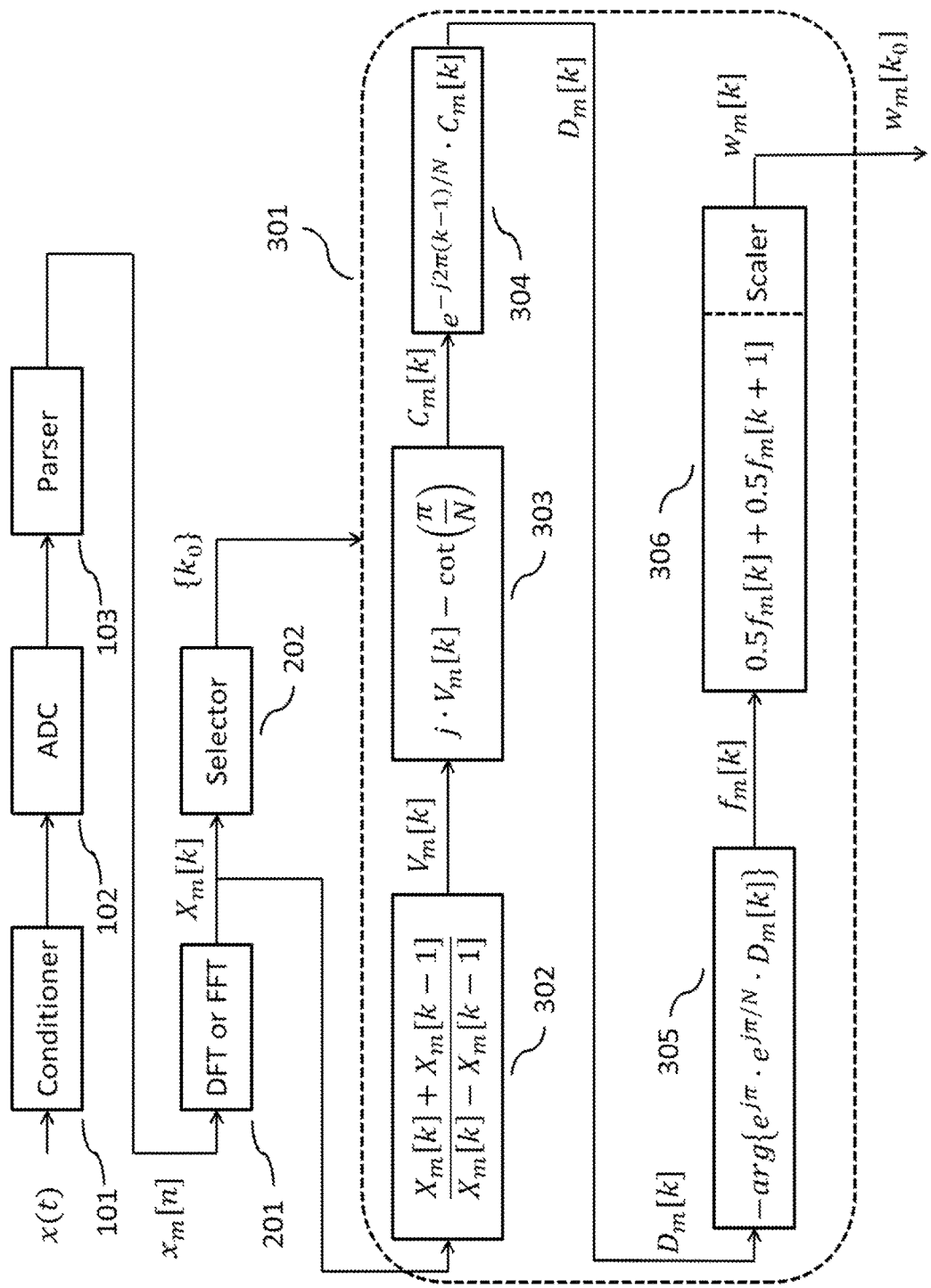
FIG. 1 depicts the present invention, referred to hereinafter as a DFT/FFT-based 1st-order difference multi-tone frequency measurement (1 ODMTM) apparatus.

Referring to FIG. 1, the DFT/FFT-based 1st-order difference multi-tone frequency measurement (1ODMTM) apparatus is comprised of the components and sub-components as shown. Operation of the 1ODMTM is as follows. An input signal, x(t), is conditioned by Conditioner 101, sampled by Analog-to-Digital-Converter (ADC) 102 to form the sequence x[n], and then parsed into length N segments by Parser 103. Here, n is an indexing variable corresponding to time, and is integer valued. Likewise, m is an integer-valued index resulting from the parsing of x[n], corresponding to the segment number.

The mth segment input to the device is designated as $x_m[n]$, and is processed by component 201 which performs an N-point Discrete Fourier Transform (DFT) or Fast Fourier Transform (FFT), $X_m[k]$. The integer index, $1 \le k \le N$, is the kth frequency bin along the discrete frequency independent variable. The output of component 201, $X_m[k]$, is input to both Selector 202 and sub-component 302 of component 301. Selector 202 identifies a set of frequency indices, $\{k_0\}$, for which frequency measurements are to be determined. Selector 202 can, for example, be implemented as a threshold and detect process, but is not limited to such a process.

Component 301 is a novel element in the apparatus and is now described in detail. For efficiency, the processing in component 301 is performed for the set of values $k=k_0$. Processing in component 301 proceeds as follows. Sub-component 302 determines the ratio, $V_m[k]=(X_m[k]+X_m[k-1])/(X_m[k]-X_m[k-1])$. This serves as input to sub-component 303, which determines $C_m[k]$$jV_m[k]$$-\cot(\pi/N)$. Sub-component 304 performs the product, $D_m[k]= e^{(-j2\pi(k-1)/N)} \cdot C_m[k]$. This result is then processed by sub-component 305, which determines $f_m[k]=-\arg\{e^{j\pi} \cdot e_{(j\pi/N)} \cdot D_m[k]\}$. Completing the processing steps, sub-component 306 determines the frequency measurements, $w_m[k]$, an averaged and scaled version of $f_m[k]$. As an initial process, sub-component 306 determines $\rho_m[k]=0.5f_m[k]+0.5f_m[k+1]$. The Scaler process of sub-component 306 decides if the absolute value, $|f_m[k]-f_m[k+1]|$, is greater than $\pi$. If so, then a modification is accomplished as $\beta_m[k]=-\pi \cdot \text{sign}(\rho_m[k])+\rho_m[k]$. Otherwise, $\beta_m[k]=\rho_m[k]$. Here, the sign( ) function is +1 if the argument is greater than or equal to 0, and −1 if the argument is less than 0. The Scaler 306 then outputs $w_m[k]=(0.5N/\pi) \cdot \beta_m m[k]$. Other final scaling can be used depending on the desired unit of frequency. Index shifts designated as either k−1 or k+1 in component 301 are performed in a circular fashion to be consistent with the properties of discrete Fourier transforms.

ADVANTAGES OF THE PRESENT INVENTION

Prior art is represented by components 201 and 202 shown in FIG. 1. Efficient single and multi-tone frequency measurement can be achieved using the prior art. However, even though such prior art is efficient and has desirable noise-reduction properties, frequency measurement accuracy is limited to $2\pi/N$ radians. The 1ODMTM of the present invention leverages the noise-reduction properties of component 201 in achieving increased frequency measurement accuracy.

Figure 2:
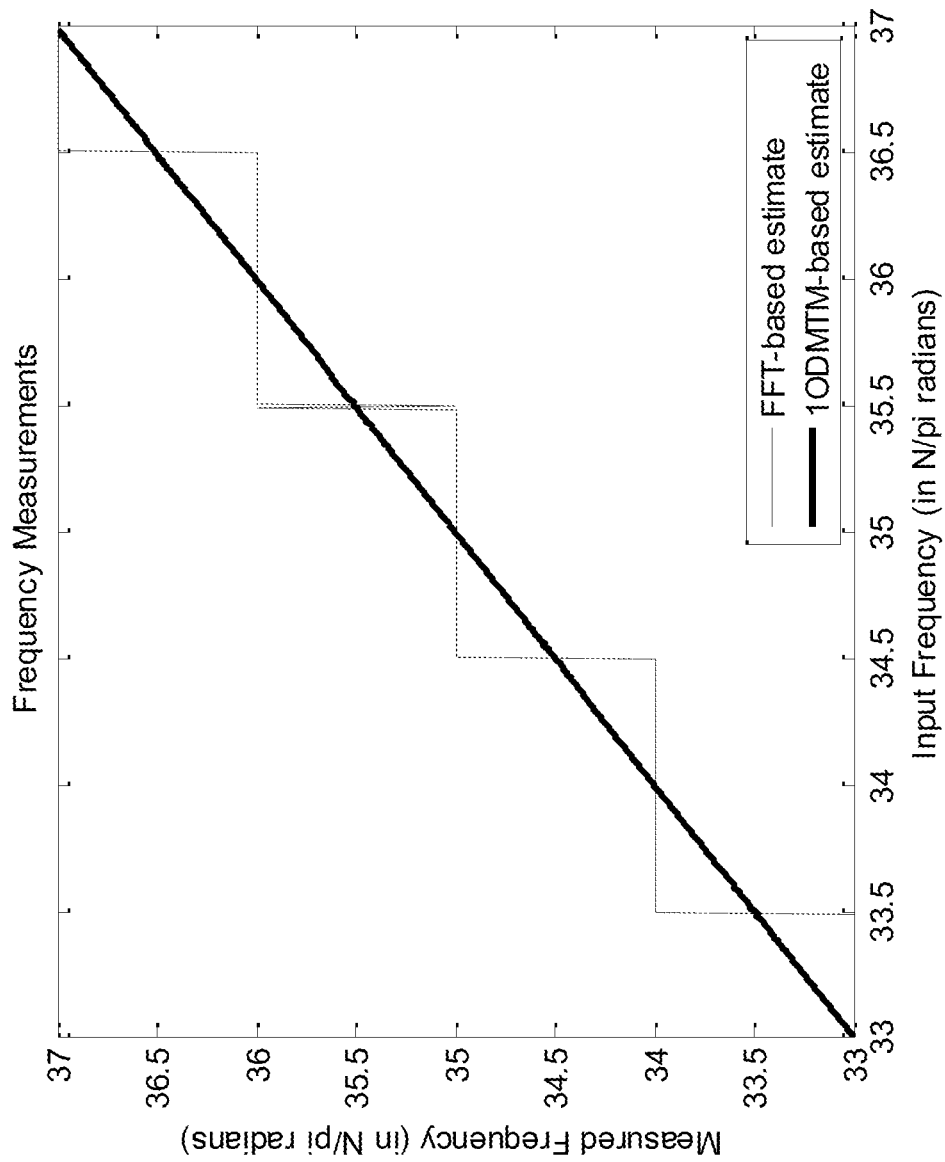
FIG. 2 depicts an example measurement performance of the 1ODMTM compared to the Hanning-windowed, peak-picked FFT. The input frequency shown on the x-axis represents the true frequency, and the y-axis is the measured frequency; the input signal is noise-free; the FFT size is 128 samples.
Figure 3:
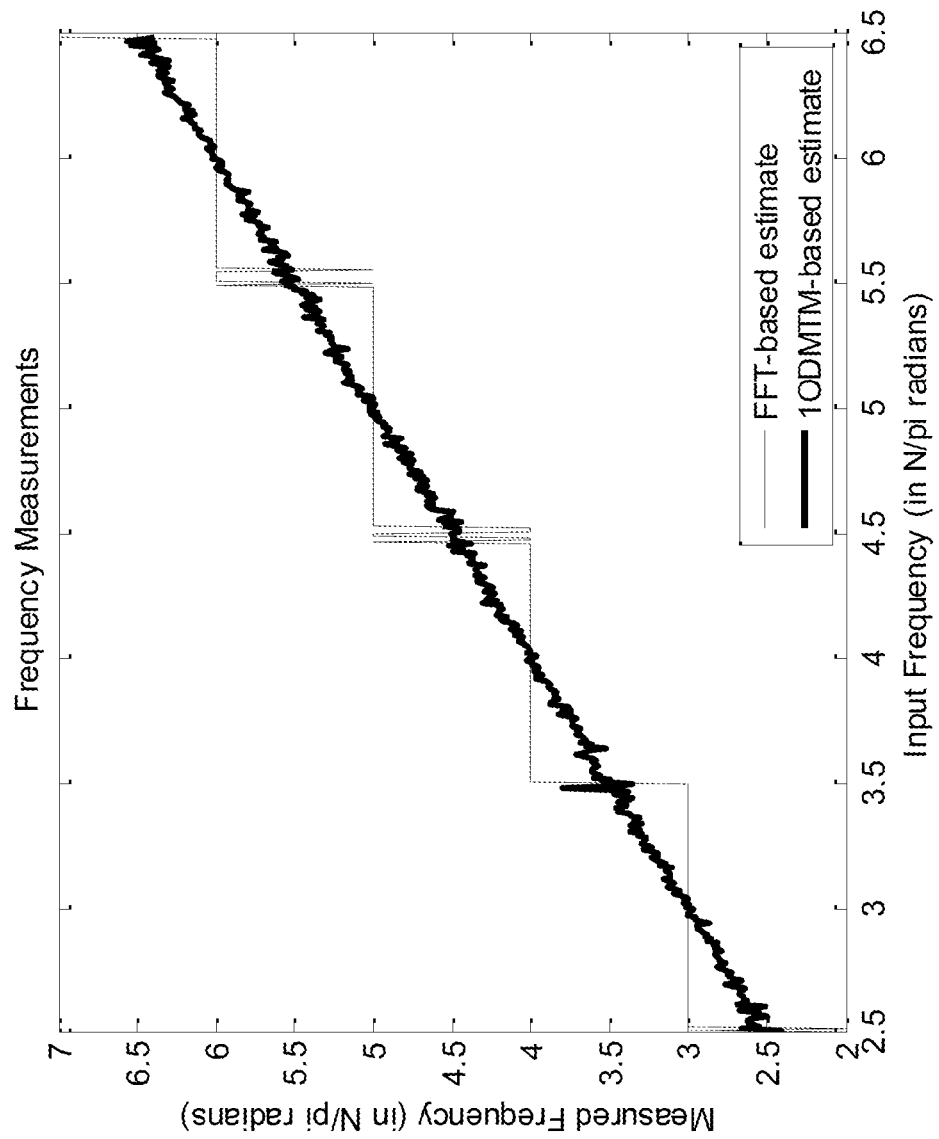
FIG. 3 depicts an example measurement performance of the 1ODMTM compared to the Hanning-windowed, peak-picked FFT. The input frequency shown on the x-axis represents the true frequency, and the y-axis is the measured frequency; the input signal-to-noise power ratio is 9 dB; the FFT size is 128 samples.
Figure 4:
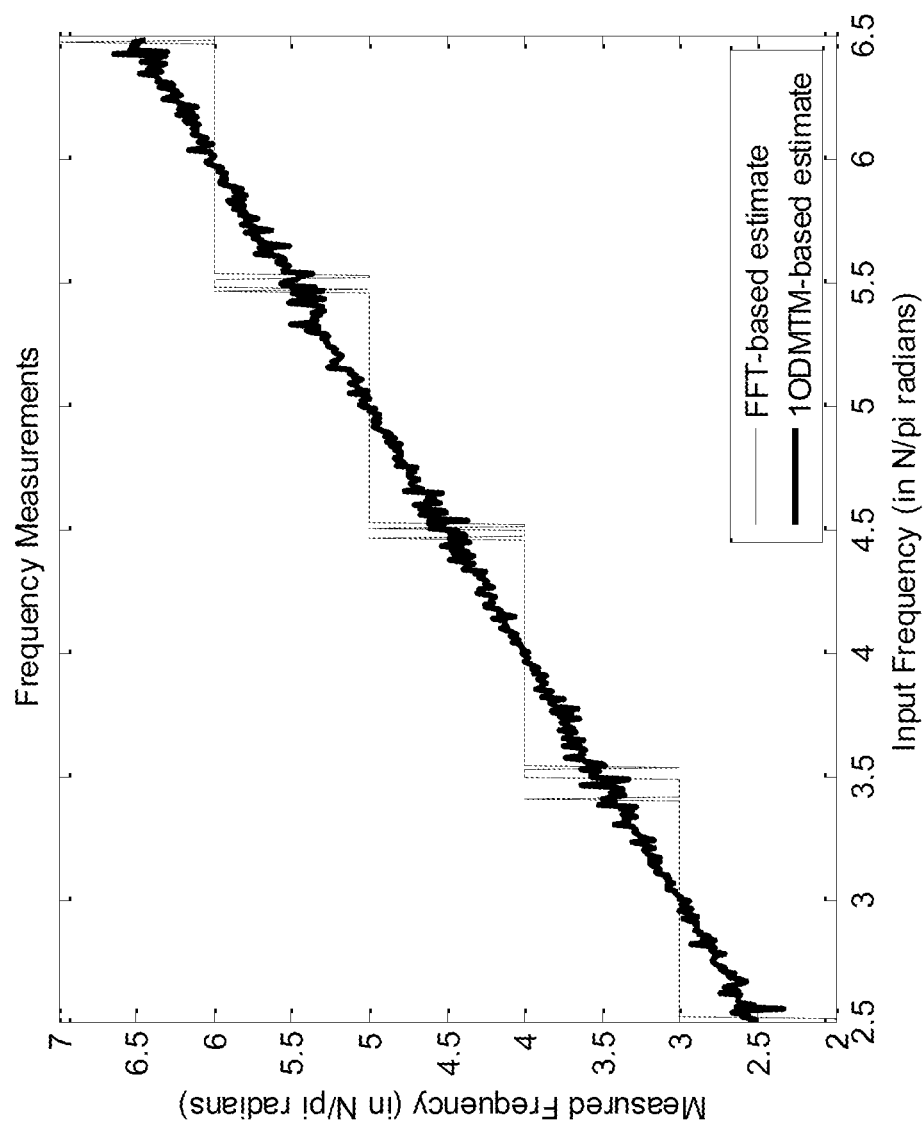
FIG. 4 depicts an example measurement performance of the 1ODMTM compared to the Hanning-windowed, peak-picked FFT. The input frequency shown on the x-axis represents the true frequency, and the y-axis is the measured frequency; the input signal-to-noise power ratio is 6 dB; the FFT size is 128 samples.
Figure 5:
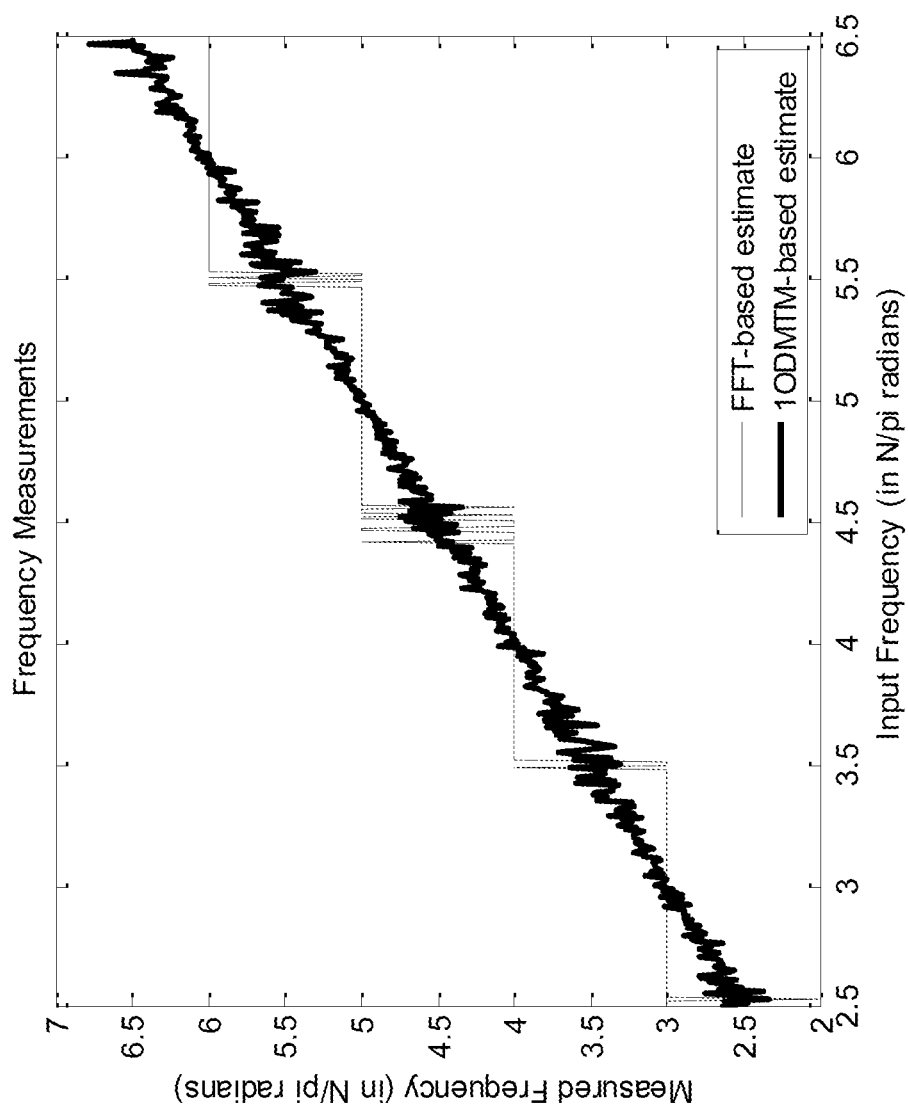
FIG. 5 depicts an example measurement performance of the 1ODMTM compared to the Hanning-windowed, peak-picked FFT. The input frequency shown on the x-axis represents the true frequency, and the y-axis is the measured frequency; the input signal-to-noise power ratio is 3 dB; the FFT size is 128 samples.
Figure 6:
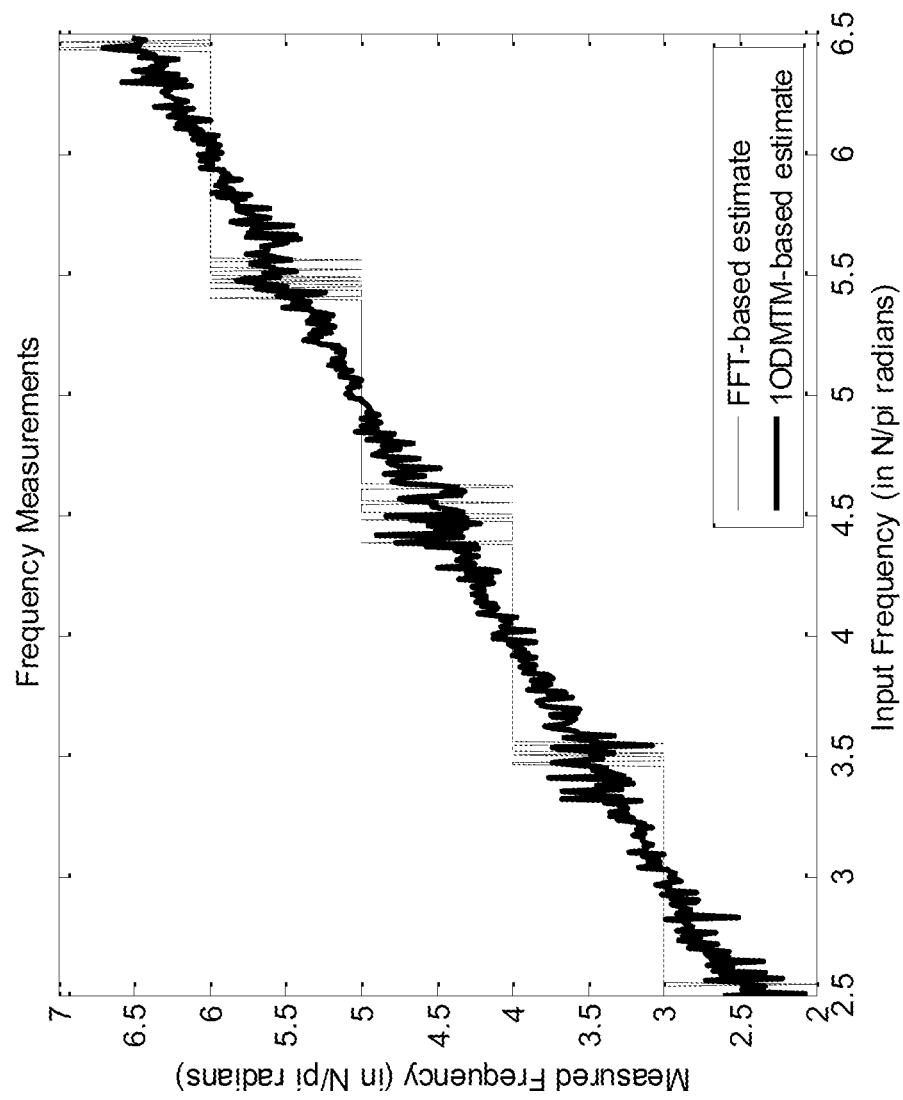
FIG. 6 depicts an example measurement performance of the 1ODMTM compared to the Hanning-windowed, peak-picked FFT. The input frequency shown on the x-axis represents the true frequency, and the y-axis is the measured frequency; the input signal-to-noise power ratio is 0 dB; the FFT size is 128 samples.
Figure 7:
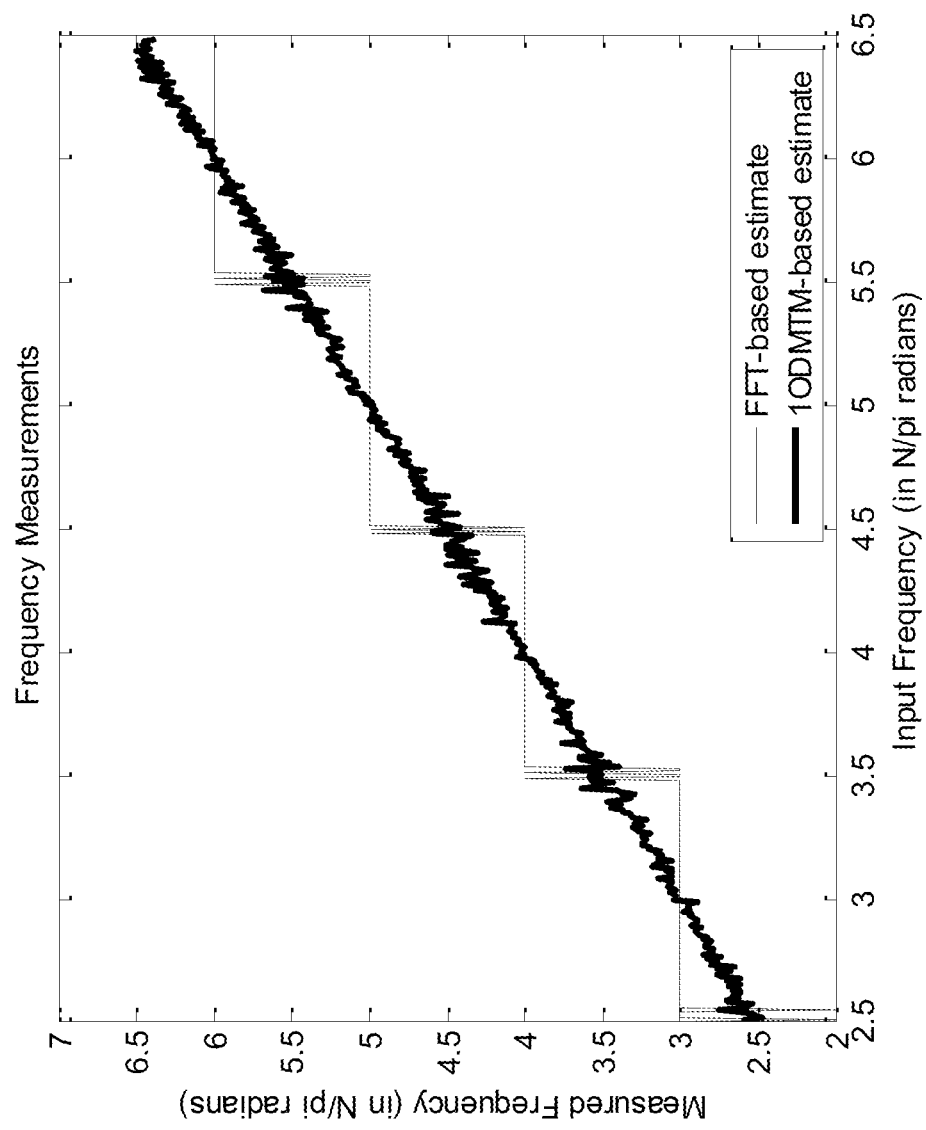
FIG. 7 depicts an example measurement performance of the 1ODMTM compared to the Hanning-windowed, peak-picked FFT. The input frequency shown on the x-axis represents the true frequency, and the y-axis is the measured frequency; the input signal-to-noise power ratio is 9 dB; the FFT size is 64 samples.
Figure 8:
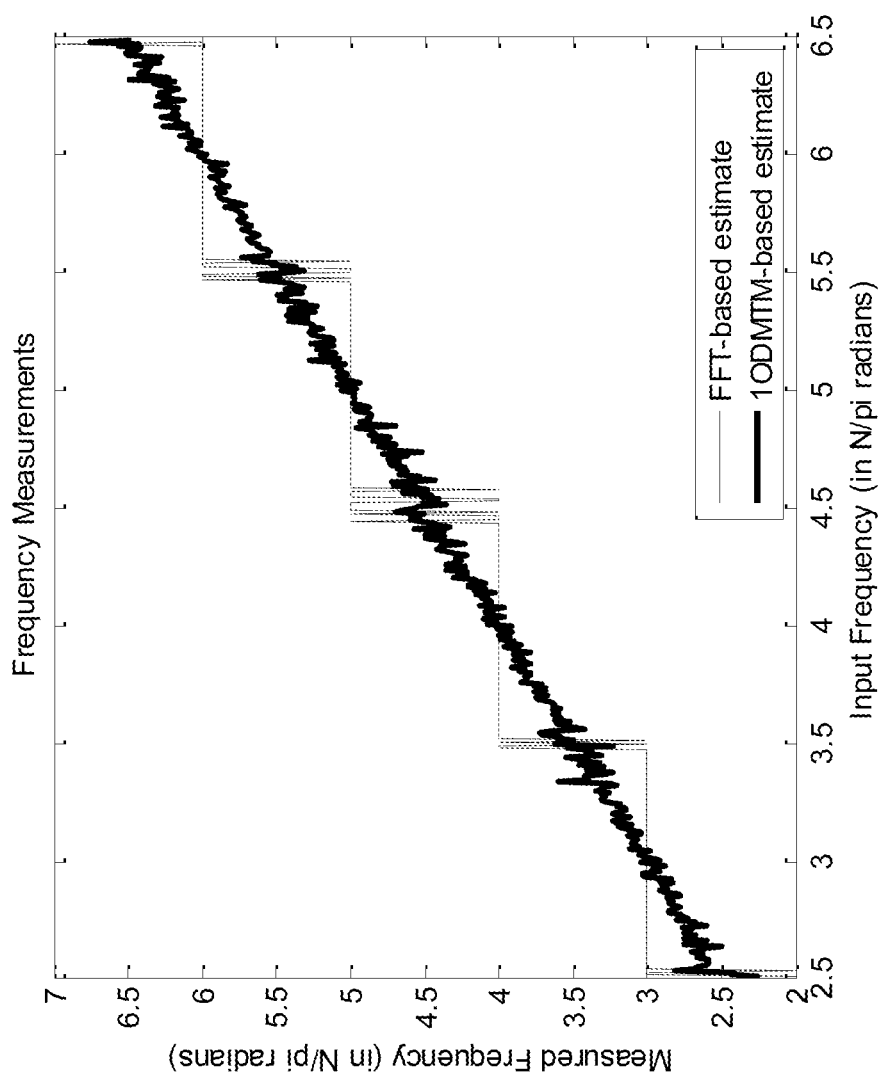
FIG. 8 depicts an example measurement performance of the 1ODMTM compared to the Hanning-windowed, peak-picked FFT. The input frequency shown on the x-axis represents the true frequency, and the y-axis is the measured frequency; the input signal-to-noise power ratio is 9 dB; the FFT size is 32 samples.
Figure 9:
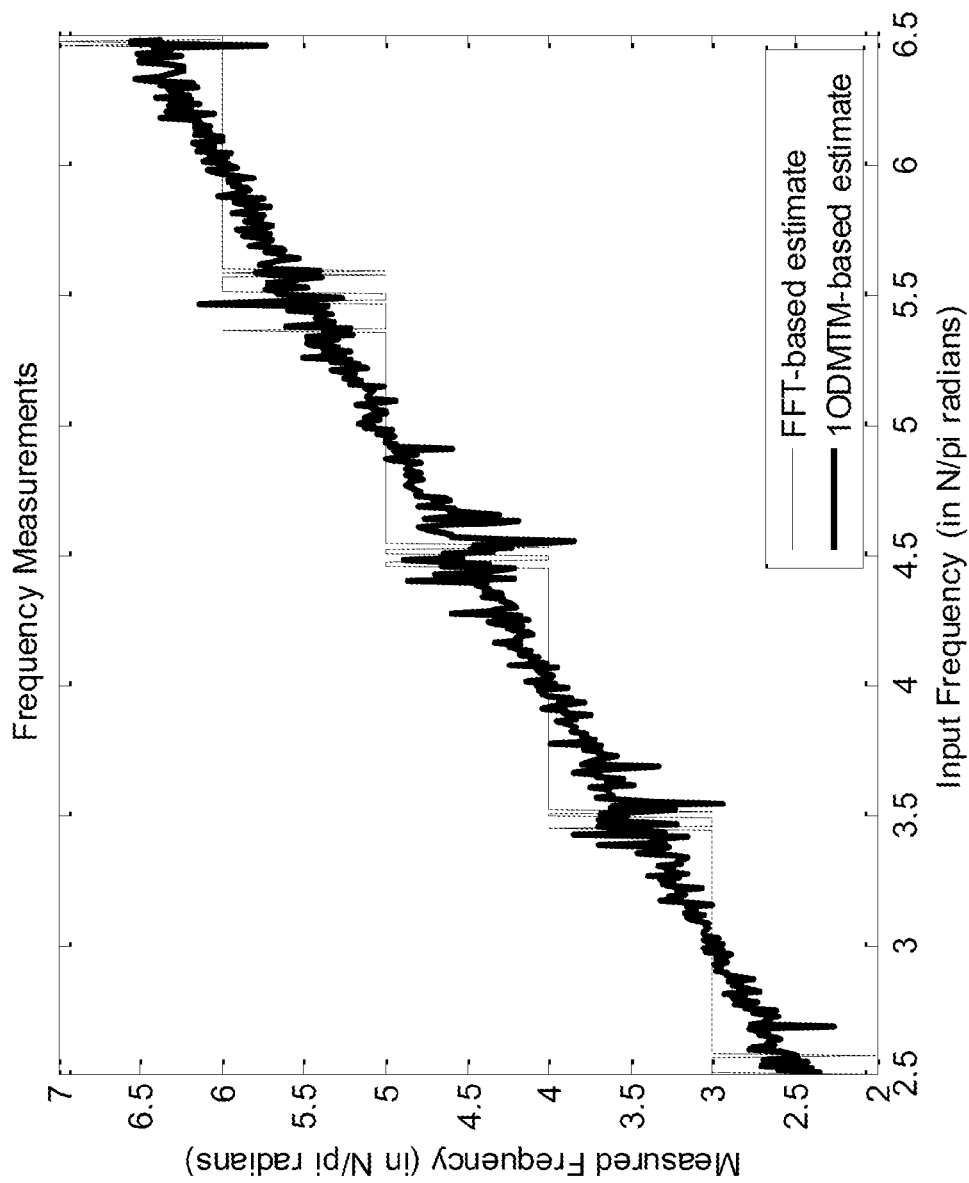
FIG. 9 depicts an example measurement performance of the 1ODMTM compared to the Hanning-windowed, peak-picked FFT. The input frequency shown on the x-axis represents the true frequency, and the y-axis is the measured frequency; the input signal-to-noise power ratio is 9 dB; the FFT size is 16 samples.

FIG. 2 through FIG. 9 are example performance plots generated for various scenarios, as simulated in the Matlab™ environment. The baseline chosen for comparison is the peak-picked FFT. As seen in FIG. 2, the peak-picked FFT is limited to integer-valued frequency bin locations, and therefore only provides a discretized, biased measurement of the input frequency. Conversely, the 1ODMTM performance is shown to give the correct measurement, without introducing bias and without discretization. Likewise, FIG. 3 through FIG. 9 are additional scenarios chosen to display the performance capability of the 1ODMTM of the present invention relative to the baseline peak-picked FFT. Note that as input signal-to-noise power ratio decreases, the baseline performs erratically when the input signal frequency is near an FFT bin edge. This is problematic for the baseline performance, because the input frequency is generally unknown, and could be located near such a frequency bin edge. In contrast, the 1ODMTM of the present invention performs well in all frequency ranges of potential interest.

ALTERNATIVES TO THE PRESENT INVENTION

Various modes of the invention can include software implementation, firmware implementation, hardware implementation and/or hybrid (software/firmware/hardware) implementations. Variations also include specific methods of accomplishing the components and sub-components such as using look-up-tables, Field Programmable Gate Arrays (FPGAs), trigonometric identities, combining components or sub-components into mathematical equivalents, etc.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An apparatus for frequency measurement, comprising:
   a signal conditioner having an input and an output;
   an analog-to-digital converter having an input and an output;
   a parser having an input and an output;
   a Fourier Transformer having an input and an output;
   a selector having an input and an output; and
   a processor having a signal input, an output, and a coefficient input, wherein,
      an external analog signal to be measured is input into said input of said signal conditioner;
      the output of said signal conditioner is connected to the input of said analog-to-digital converter;
      the output of said analog-to-digital converter is connected to the input of said parser;
      the output of said parser is connected to the input of said Fourier Transformer;
      the output of said Fourier Transformer is connected to the signal input of said processor and to the input of said selector; and wherein
      the output of said selector is connected to the coefficient input of said processor;
   wherein said parser parses a digital output of said analog-to-digital converter x[n] into m data segments of length N, wherein the $m^{th}$ said segment is represented as $x_m[n]$;
   wherein said Fourier Transformer performs an N-point Discrete Fourier Transform on $x_m[n]$, resulting in $X_m[k]$,
      wherein k is the $k^{th}$ frequency bin along a discrete frequency independent variable, and
      $X_m[k]$ is the Discrete Fourier Transform of any said data segment;
   wherein said Fourier Transformer performs a Fast Fourier Transform on $x_m[n]$, resulting in $X_m[k]$, wherein
      k is the $k^{th}$ frequency bin along a discrete frequency independent variable, and
      $X_m[k]$ is the Fast Fourier Transform of any said data segment;
   wherein said selector selects a set of frequency indices for which frequency measurements are to be performed;

wherein said selector performs a threshold and detect function;

wherein said processor performs a first step of processing a ratio represented by $$V_m[k]=(X_m[k]+X_m[k-1])/(X_m[k]-X_m[k-1])$$

and inputs the result into a second step of processing; and wherein said processor performs a second step of processing represented by $$C_m[k]=jV_m[k]-\cot(\pi/N)$$

and inputs the result into a third step of processing.

2. The apparatus of claim 1, wherein said processor performs a third step of processing represented by $$D_m[k]=e^{(-j2\pi(k-1)/N)} \cdot C_m[k]$$

and;

inputs the result into a fourth step of processing.

3. The apparatus of claim 2, wherein said processor performs a fourth step of processing represented by $$f_m[k]=-\arg\{e^{j\pi} \cdot e^{(j\pi/N)} \cdot D_m[k]\}$$

and;

inputs the result into a fifth step of processing.

4. The apparatus of claim 3, wherein said processor performs a fifth step of processing represented by $$\rho_m[k]=0.5f_m[k]+0.5f_m[k+1];$$

and performs a scaler function.

5. The apparatus of claim 4, wherein said scaler function further comprises the steps of processing represented by $$\beta_m[k]=-\pi \cdot \text{sign}(\rho_m[k])+\rho_m[k]$$

when $|f_m[k]-f_m[k+1]|$ is greater than $\pi$; and processing $$\beta_m[k]=\rho_m[k]$$

otherwise; and processing an averaged and scaled frequency measurement represented by $$w_m[k]=(0.5N/\pi) \cdot \beta_m[k].$$

\* \* \* \* \*